US012603031B2

(12) United States Patent
Shin et al.

(10) Patent No.: US 12,603,031 B2
(45) Date of Patent: Apr. 14, 2026

(54) DISPLAY DEVICE AND CONTROLLER

(71) Applicant: LG Display Co., Ltd., Seoul (KR)

(72) Inventors: Beomjun Shin, Paju-si (KR);
Gyeongho Ryu, Paju-si (KR)

(73) Assignee: LG DISPLAY CO., LTD., Seoul (KR)

( * ) Notice: Subject to any disclaimer, the term of this
patent is extended or adjusted under 35
U.S.C. 154(b) by 0 days.

(21) Appl. No.: 18/924,808

(22) Filed: Oct. 23, 2024

(65) Prior Publication Data

US 2025/0201166 A1      Jun. 19, 2025

(30) Foreign Application Priority Data

Dec. 18, 2023      (KR) ........................ 10-2023-0184076

(51) Int. Cl.
| | |
|---|---|
| *G09G 3/20* | (2006.01) |
| *G06F 3/06* | (2006.01) |
| *G09G 3/36* | (2006.01) |
| *G09G 5/18* | (2006.01) |
| *G11C 8/06* | (2006.01) |

(52) U.S. Cl.
CPC ......... *G09G 3/2074* (2013.01); *G06F 3/0688*
(2013.01); *G09G 3/20* (2013.01); *G09G*
*3/3648* (2013.01); *G09G 5/18* (2013.01);
*G11C 8/06* (2013.01); *G09G 2300/02*
(2013.01); *G09G 2300/0842* (2013.01); *G09G*
*2310/061* (2013.01); *G09G 2310/08* (2013.01);
*G09G 2320/0626* (2013.01); *G09G 2330/023*
(2013.01); *G09G 2360/12* (2013.01); *G09G*
*2360/127* (2013.01); *G09G 2360/18* (2013.01);
*G09G 2380/10* (2013.01)

(58) Field of Classification Search
CPC .... G09G 2310/08; G09G 3/3648; G09G 3/20;
G09G 2370/08; G09G 3/3677; G09G
3/3611; G09G 3/3688; G09G 2330/021;
G09G 2300/0842; G09G 3/2096; G09G
2360/18; G09G 5/18; G09G 2360/127;
G09G 2360/126; G09G 2360/12; G06F
3/0634; G11C 11/4093; G11C 7/10;
G11C 5/04; G11C 11/4076; G11C 7/1045
See application file for complete search history.

(56) References Cited

U.S. PATENT DOCUMENTS

| | | | | |
|---|---|---|---|---|
| 2009/0213033 A1* | 8/2009 | Chen | ..................... | G09G 3/3611 |
| | | | | 345/1.1 |
| 2010/0073387 A1* | 3/2010 | Jani | ........................... | G09G 5/39 |
| | | | | 345/557 |
| 2013/0057763 A1* | 3/2013 | Cha | ........................... | G09G 5/12 |
| | | | | 348/554 |
| 2015/0103104 A1* | 4/2015 | Lee | ...................... | G09G 3/3648 |
| | | | | 345/690 |

(Continued)

*Primary Examiner* — Dismery Mercedes
(74) *Attorney, Agent, or Firm* — Birch, Stewart, Kolasch
& Birch, LLP

(57) ABSTRACT

A display device can include a display panel having a
plurality of subpixels, a memory storing image control data
for controlling an image displayed on the display panel, a
mode control signal generation circuit generating a mode
control signal based on a first mode signal supplied from a
first controller, and a second controller configured to share
the memory with the first controller and determine a control
authority of the first controller for the memory through the
mode control signal.

21 Claims, 8 Drawing Sheets

(56)        References Cited

U.S. PATENT DOCUMENTS

| | | | | |
|---|---|---|---|---|
| 2015/0340074 A1* | 11/2015 | Shin | ......................... | G11C 8/10 |
| | | | | 365/201 |
| 2016/0117101 A1* | 4/2016 | Choi | .................... | G06F 3/0688 |
| | | | | 711/105 |
| 2016/0132265 A1* | 5/2016 | Yi | ........................ | G06F 3/0614 |
| | | | | 711/105 |
| 2016/0196206 A1* | 7/2016 | Kang | ................. | G06F 13/1694 |
| | | | | 711/171 |
| 2017/0344311 A1* | 11/2017 | Oh | ........................ | G06F 3/0659 |
| 2021/0089395 A1* | 3/2021 | Song | ................... | G06F 11/1679 |
| 2021/0133028 A1* | 5/2021 | Kim | .................... | G06F 11/1004 |
| 2021/0295752 A1* | 9/2021 | Chen | ...................... | G09G 3/006 |

* cited by examiner

DISPLAY DEVICE AND CONTROLLER

CROSS-REFERENCE TO RELATED APPLICATION

This application claims priority to Korean Patent Application No. 10-2023-0184076, filed in the Republic of Korea on Dec. 18, 2023, the entire contents of which is hereby expressly incorporated by reference for all purposes as if fully set forth into the present application.

BACKGROUND

Field

Embodiments of the disclosure relate to a display device and a controller and, more specifically, to a display device and a controller that, when a plurality of controllers share one memory, enable a smooth mode switch to use the memory between the plurality of controllers.

Discussion of the Related Art

The growth of the intelligent society leads to increased demand for image display devices and use of various types of display devices, such as liquid crystal displays, organic light emitting displays, etc.

Among these display devices, the organic light emitting display device uses self-emissive organic light emitting diodes, providing advantages, such as a fast response and better contrast ratio, luminous efficiency, luminance, and viewing angle.

The display device can include light emitting elements respectively arranged in a plurality of subpixels disposed on a display panel. The light emitting elements emit light by controlling the voltage applied to the light emitting elements, thereby displaying images while controlling the brightness of each subpixel.

Recently, the area of use of the display devices is gradually expanding, including not only portable computers but also desktop computer monitors, displays for vehicle systems, and wall-mounted televisions.

The display device can provide various functions depending on the use of the electronic device equipped with the display panel. For example, in the case of a display device for a vehicle system, a first controller provided in the vehicle system and a second controller provided in the display device can share one memory.

As such, when a plurality of controllers share one memory, a failure in smooth mode switching to use the memory between the plurality of controllers can cause a temporary shutoff of the display screen or a need for resetting the display power.

SUMMARY OF THE DISCLOSURE

Thus, the inventors of the disclosure have invented a display device and a controller that, when a plurality of controllers share one memory, enable a smooth mode switch to use the memory between the plurality of controllers.

Embodiments of the disclosure can provide a display device and a controller that can enable a smooth mode switch to use a memory between a plurality of controllers by detecting a first mode period in which a first controller uses the memory and controlling a second controller in a high-impedance state in the first mode period.

Embodiments of the disclosure can provide a display device and a controller capable of effectively detecting a first mode period in which a first controller uses a memory using a chip selection signal and a memory enable signal generated for the first controller to use the memory.

Embodiments of the disclosure provide a display device comprising a display panel including a plurality of subpixels, a memory storing image control data for controlling an image displayed on the display panel, a mode control signal generation circuit generating a mode control signal based on a first mode signal supplied from a first controller, and a second controller configured to share the memory with the first controller and determine a control authority of the first controller for the memory through the mode control signal.

Embodiments of the disclosure can provide a timing controller comprising a first edge detection circuit generating a mode enable edge signal by detecting an edge where a mode enable signal supplied from a host controller is turned on, a second edge detection circuit generating a chip selection edge signal by detecting an edge where a chip selection signal supplied from the host controller is turned off, a first logic gate generating a mode control signal for determining a control authority of the host controller for a memory using the mode enable edge signal and the chip selection edge signal, and a second logic gate generating a reset signal for a reset operation of the first edge detection circuit and the second edge detection circuit using the mode enable edge signal and the chip selection edge signal, wherein the timing controller shares the memory with the host controller.

According to embodiments of the disclosure, it is possible to, when a plurality of controllers share one memory, enable a smooth mode switch to use the memory between the plurality of controllers.

According to embodiments of the disclosure, it is possible to enable a low-power driving capable of saving power consumption by detecting a first mode period in which a first controller uses a memory and controlling a second controller in a high-impedance state in the first mode period to thereby reduce unnecessary driving loss.

According to embodiments of the disclosure, it is possible to effectively detect a first mode period in which a first controller uses a memory using a chip selection signal and a memory enable signal generated for the first controller to use the memory.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
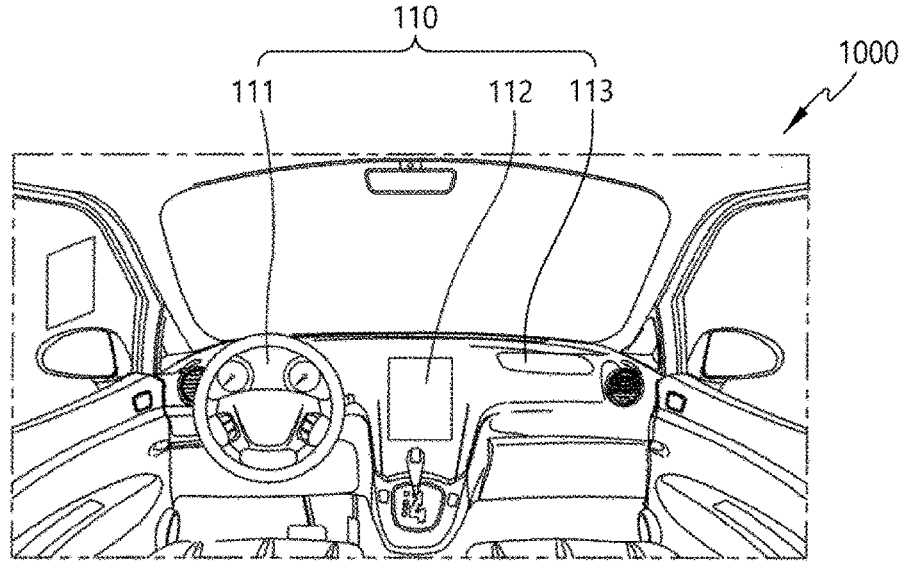
FIG. 1 is a partial view illustrating an example of an inside of a vehicle system according to embodiments of the disclosure.

Hereinafter, some embodiments of the disclosure will be described in detail with reference to example drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. In the present application, the phrase "the disclosure" means the present disclosure, the present invention, the invention, etc.

Further, in the following description of examples or embodiments of the disclosure, detailed descriptions of well-known functions and components incorporated herein will be omitted when it is determined that the description can make the subject matter in some embodiments of the disclosure rather unclear.

The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "can" fully encompasses all the meanings of the term "may".

Hereinafter, various embodiments of the disclosure will be described in detail with reference to the accompanying drawings. All the components of each system and each device according to all embodiments of the disclosure are operatively coupled and configured.

FIG. 1 is a partial view illustrating an example of an inside of a vehicle system according to embodiments of the disclosure.

Referring to FIG. 1, a vehicle system 1000 according to embodiments of the disclosure can include a driver seat and a passenger seat, a dashboard positioned in front of the driver seat and the passenger seat and on which various instruments necessary for driving are disposed, and a center fascia having a control plate of an electronic device.

The dashboard can include a first display panel 111 that displays information necessary for driving, including a speedometer. The first display panel 111 can be referred to as a dashboard display panel.

The first display panel 111 is a display panel capable of safely driving the vehicle system 1000 by transferring information about the driving state of the vehicle system 1000 and operations of various electronic devices provided in the vehicle system 1000 to the driver. A speedometer indicating the driving speed, a tripmeter indicating the driving distance, a tachometer indicating the revolutions per meter (RPM) of the engine, a fuel gauge, a water thermometer, an engine thermometer, and various warning lamps can be displayed through the first display panel 111. The first display panel 111 can be positioned behind a steering wheel with respect to the driver seat.

The center fascia is positioned between the driver seat and the passenger seat, and can correspond to an area where the dashboard and the shift lever meet vertically, and an audio, an air conditioner, a heater controller, a navigator, a blower, a cigar jack, an ashtray, a cup holder, and the like can be disposed therein. Further, the center fascia can include a second display panel 112.

The second display panel 112 can direct a route to a destination or display a map image corresponding to a current location, and display a user interface related to control of various electronic devices installed in the vehicle system 1000. Further, when the vehicle system 1000 and the mobile terminal are connected, a screen provided by the mobile terminal can be displayed.

The second display panel 112 positioned between the driver seat and the passenger seat of the vehicle system 1000 can be referred to as a center fascia display panel.

Further, a third display panel 113 for convenience of a passenger in the passenger seat can be additionally installed in front of the passenger seat. The third display panel 113 positioned in front of the passenger seat can be referred to as a passenger seat display panel.

In addition, the display panel 110 included in the vehicle system 1000 can further include at least one of a front window display panel, a side mirror display panel, a rearview mirror display panel, and a side window display panel, in addition to the dashboard display panel 111, the center fascia display panel 112, and the passenger seat display panel 113. Further, various types of display panels can be installed.

The front window display panel can be a display panel that projects a virtual image to a partial area of the front window capable of viewing the front of the vehicle system 1000. By displaying the speed of the vehicle system, the remaining amount of fuel, the route direction information, and the like through the front window display panel, it is possible to minimize the driver's unnecessary gaze changing in different directions.

The side mirror display panel can be a display panel capable of displaying an image of a side captured through a side camera in a partial area or an entire area of the side mirror formed to view the side of the vehicle system 1000. Accordingly, the driver can identify not only the image of the side reflected through the side mirror, but also the image of the side captured through the side camera through the side mirror display panel.

The rear-view mirror display panel can be a display panel capable of displaying an image of the rear captured by the rear camera in a partial area or an entire area of the rear-view mirror formed to view the rear of the vehicle system 1000. Accordingly, the driver can identify not only the rear image reflected through the rear-view mirror, but also the rear image captured through the rear camera through the rear-view mirror display panel.

The side window display panel can be a display panel that projects a virtual image onto a partial area of the side window capable of viewing a side of the vehicle system 1000. Various information about the vehicle system 1000 can be displayed through the side window display panel.

Figure 2:
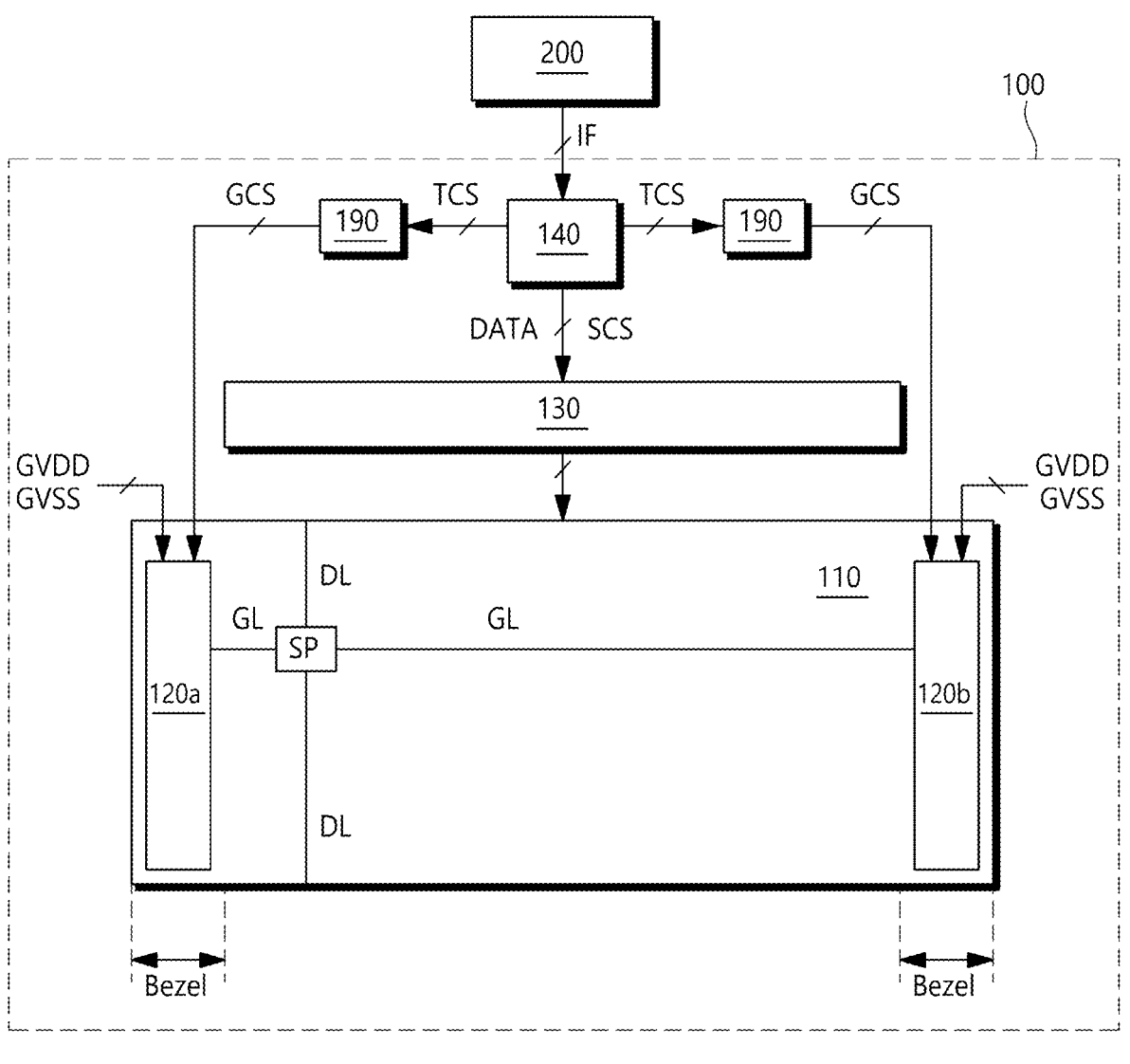
FIG. 2 is a view schematically illustrating a display device according to embodiments of the disclosure.

FIG. 2 is a view schematically illustrating a display device according to embodiments of the disclosure.

Referring to FIG. 2, a display device 100 according to embodiments of the disclosure can include a display panel 110, a gate driving circuit 120, a data driving circuit 130, a timing controller 140, and a level shifter 190.

In the display panel 110, a plurality of data lines DL and a plurality of gate lines GL can intersect each other, and subpixels SP can be disposed in a matrix form in each intersection area, forming a subpixel array.

In the case of a liquid crystal display device, the display panel 110 can include a liquid crystal layer formed between two substrates and can be operated in any known mode, such as a twisted nematic (TN) mode, a vertical alignment (VA) mode, an in-plane switching (IPS) mode, or a fringe field switching (FFS) mode. In the case of an organic light emitting display device, the display panel 110 can be implemented in a top emission scheme, a bottom emission scheme, or a dual-emission scheme.

One subpixel SP can include, e.g., a thin film transistor (TFT) disposed in an area formed by one data line DL and one gate line GL, a light emitting element that emits light according to a data voltage, and a storage capacitor electrically connected to the light emitting element to maintain the data voltage. The thin film transistor can include a driving transistor and one or more switching transistors, and can be implemented as a P-type transistor or an N-type transistor. Alternatively, it can be implemented in a hybrid form in which a P-type transistor and an N-type transistor are mixed.

For example, when the display device 100 having a resolution of 2,160×3,840 includes four subpixels SP of white (W), red (R), green (G), and blue (B), the data lines DL can be connected to 2,160 gate lines GL and four subpixels WRGB, and thus, there can be provided 3,840× 4=15,360 data lines DL. Each subpixel SP is disposed in the area formed by the gate line GL and the data line DL.

The timing controller 140 can receive an interface signal IF from a host controller 200 through a designated interface scheme and convert the same into image data DATA used inside.

In the case of the display device 100 for the vehicle system 1000, the host controller 200 and the display device

100 can use a low voltage differential signaling (LVDS) interface or a serial peripheral interface (SPI).

In the low voltage differential signaling (LVDS) interface, the interface signal IF transferred from the host controller 200 to the display device 100 can be a low voltage differential data signal.

The low voltage differential signaling (LVDS) interface is a standard interface defined in ANSI/TIA/EIA-644 that can be used as an interface in areas requiring high-speed data transmission, low power consumption, and noise immunity. When the low voltage differential signaling (LVDS) interface is used, since the interface signal IF is transmitted as a differential input signal having a swing width of about 350 mV, it enables high noise immunity and high-speed data transmission.

The serial peripheral interface (SPI) is a synchronous communication scheme that supports one-to-many (1: N) interface communication, has a high speed, and can be used for communication between chips such as memory. For example, in the case of the vehicle system 1000, the host controller 200 provided in the vehicle system 1000 can be used to operate as a master device, and the timing controller 140 provided in the display device 100 can be used to operate as a slave device.

The serial peripheral interface SPI can include a synchronization clock signal transmitted from the host controller 200 or the timing controller 140, a master output slave input (MOSI) signal output from the master and input to the slave, a master input slave output (MISO) signal output from the slave and input to the master, and a chip selection signal. The MOSI signal can include a memory enable signal for initiating the use of the memory.

The timing controller 140 can correct the image data DATA to compensate for the driving deviation of the subpixel SP based on the sensing result of the characteristic value (e.g., the threshold voltage or mobility of the driving transistor) of the subpixel and then transmit it to the data driving circuit 130.

The timing controller 140 can receive timing signals, such as a vertical synchronization signal, a horizontal synchronization signal, and a data enable signal from the host controller 200, together with the interface signal IF. The timing controller 140 generates a source control signal SCS for controlling the operation timing of the data driving circuit 130 and a timing control signal TCS for controlling the operation timing of the gate driving circuit 120 based on the timing signal input from the host controller 200.

The source control signal SCS includes a source sampling clock signal, a source output enable signal, and the like. The source sampling clock signal is a clock signal for controlling the sampling timing of the image data DATA in the data driving circuit 130 based on the rising or falling edge of the source sampling clock signal. The source output enable signal is a signal for controlling an output timing for an analog data voltage applied to the display panel 110.

The data driving circuit 130 can include a plurality of source driving integrated chips SDIC. The data driving circuit 130 receives the image data DATA from the timing controller 140. The data driving circuit 130 generates a data voltage by converting the image data DATA into a gamma voltage in response to the source control signal SCS transferred from the timing controller 140, and synchronizes the data voltage with the scan signal of the gate driving circuit 120 and supplies the same to the data lines DL of the display panel 110.

The data driving circuit 130 can be connected to the data line DL of the display panel 110 through a chip on glass (COG) process or a tape automated bonding (TAB) process.

The display device 100 can include a level shifter 190 that generates the gate control signal GCS using the timing control signal TCS output from the timing controller 140 and supplies the generated gate control signal GCS to the gate driving circuit 120. The level shifter 190 can be positioned inside the gate driving circuit 120 or can be positioned on the source printed circuit board on which the data driving circuit 130 is disposed.

The level shifter 190 can convert a transistor-transistor-logic (TTL) level voltage of the timing control signal (TCS) input from the timing controller 140 into a voltage of a turn-on level and a voltage of a turn-off level capable of switching the transistor formed on the display panel 110. Then, the level shifter 190 supplies the gate control signal GCS to the gate driving circuit 120.

The timing control signal TCS can include an on clock signal, an off clock signal, an alternating control pulse signal, and the like.

The gate control signal GCS can include a gate start signal, a gate clock signal, an even-numbered alternating current (AC) voltage, an odd-numbered AC voltage, a line selection signal, a reset signal, and a panel on signal. The gate clock signal can be composed of N (where N is a natural number) phase clock signals having different phases. When the gate driving circuit 120 includes a scan driving circuit and an emission driving circuit, the gate start signal can include a scan start signal and a light emission start signal, and the gate clock signal can include a scan clock signal and a light emission clock signal.

For example, in a display device 100 having a resolution of 2,160×3,840, for 2,160 gate lines GL, when gate signals are sequentially output from the first gate line to the 2,160th gate line can be referred to as 2,160-phase driving. Or, when gate signals are sequentially output on a per-four gate line GL basis, like when gate signals are sequentially output from the first gate line to the fourth gate line and then gate signals are sequentially output from the fifth gate line to the eight gate line, is referred to as four-phase driving. In other words, when gate signals are sequentially output every N gate lines GL can be referred to as N-phase driving.

When the gate driving circuit 120 includes a scan driving circuit and an emission driving circuit, the gate signal can include a scan signal and a light emission signal.

Further, the gate driving circuit 120 can include one or more gate driving integrated circuits GDIC.

Based on the gate control signal GCS input from the level shifter 190 and the one or more power supply voltages GVDD and GVSS input from a display power management circuit, the gate driving circuit 120 can output the display gate signal during the display driving period and output the sensing gate signal for sensing the characteristic value of the subpixel SP during the blank period.

The gate driving circuit 120 can be directly formed on the substrate of the display panel 110 in a gate in panel (GIP) manner.

The gate driving circuit 120 can be formed in a bezel area in which an image is not displayed on the display panel 110, but is not limited thereto. The gate driving circuit 120 can be formed in a double bank structure in which the first gate driving circuit 120*a* is disposed in the first bezel area of the display panel 110 and the second gate driving circuit 120*b* is disposed in the second bezel area of the display panel 110 to minimize distortion of the gate signal due to signal delay.

The timing controller 140 can control the display driving operation and the sensing driving operation for the subpixel lines of the display panel 110 based on the source control signal SCS and the timing control signal TCS, thereby sensing the characteristic values of the subpixels SP in real time even in the period in which the image is displayed.

Here, the subpixel line refers to a collection of subpixels SP in the amount of one line, adjacent to each other in the horizontal direction.

The sensing driving operation refers to an operation of sensing the characteristic value of the corresponding subpixel SP by applying sensing data to subpixels SP disposed in a specific subpixel line, and for updating the compensation value compensating for a change in the characteristic value of the corresponding subpixel SP based on the sensing result.

The display device 100 can include a display power management circuit that supplies various voltages or currents to the display panel 110, the gate driving circuit 120, the data driving circuit 130, or the like, or controls various voltages or currents to be supplied.

The display power management circuit generates power necessary for driving the display panel 110, the gate driving circuit 120, and the data driving circuit 130 by adjusting the direct current (DC) voltage supplied from the external host system.

The display device 100 can be one of various types of devices, such as liquid crystal displays, organic light emitting diode displays, or plasma display panels.

Figure 3:
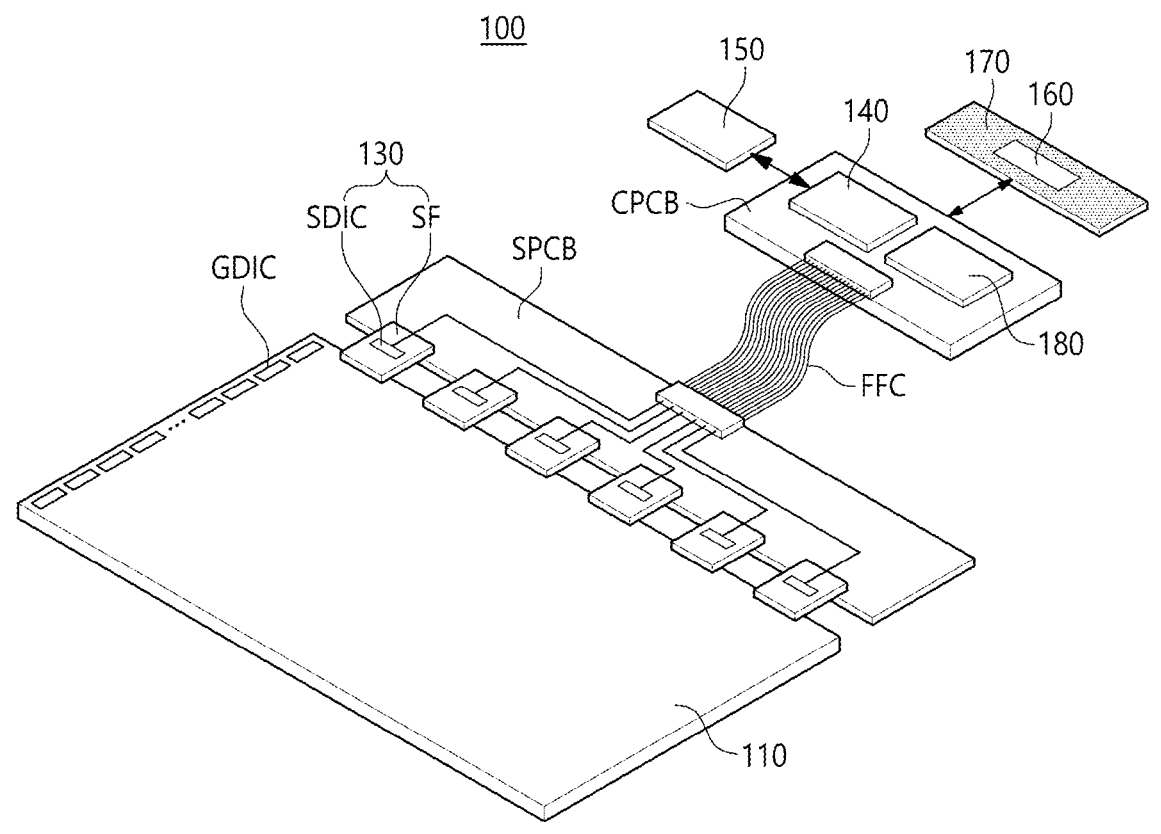
FIG. 3 is a view illustrating an example of a system of a display device according to embodiments of the disclosure.

FIG. 3 is a view illustrating an example of a system of a display device according to embodiments of the disclosure.

Referring to FIG. 3, in the display device 100 according to embodiments of the disclosure, the source driving integrated circuit SDIC included in the data driving circuit 130 is implemented in a chip-on-film (COF) type among various types (e.g., TAB, COG, or COF), and the gate driving circuit 120 is implemented in a gate-in-panel (GIP) type among various types (e.g., TAB, COG, COF, or GIP).

When the gate driving circuit 120 is implemented in the GIP type, the plurality of gate driving integrated circuits GDIC included in the gate driving circuit 120 can be directly formed in the non-display area of the display panel 110. In this case, the gate driving integrated circuits GDIC can receive various signals (e.g., a clock signal, a gate high signal, a gate low signal, etc.) necessary for generating scan signals through gate driving-related signal lines disposed in the non-display area.

Likewise, one or more source driving integrated circuits SDIC included in the data driving circuit 130 each can be mounted on the source film SF, and one side of the source film SF can be electrically connected with the display panel 110. Lines for electrically connecting the source driver integrated circuit SDIC and the display panel 110 can be disposed on the source film SF.

The display device 100 can include at least one source printed circuit board SPCB for circuit connection between a plurality of source driving integrated circuits SDIC and other devices and a control printed circuit board CPCB for mounting control components and various electric devices.

The other side of the source film SF where the source driving integrated circuit SDIC is mounted can be connected to at least one source printed circuit board SPCB. In other ways, one side of the source film SF where the source driving integrated circuit SDIC is mounted can be electrically connected with the display panel 110, and the other side thereof can be electrically connected with the source printed circuit board SPCB.

The timing controller 140 and the display power management circuit 180 can be mounted on the control printed circuit board CPCB. The timing controller 140 can control the operation of the data driving circuit 130 and the gate driving circuit 120. The display power management circuit 180 can supply driving voltage or current to the display panel 110, the data driving circuit 130, and the gate driving circuit 120 and control the supplied voltage or current.

At least one source printed circuit board SPCB and control printed circuit board CPCB can be circuit-connected through at least one connection member. The connection member can include, e.g., a flexible printed circuit FPC or a flexible flat cable FFC. The at least one source printed circuit board SPCB and control printed circuit board CPCB can be integrated into a single printed circuit board.

The display device 100 can further include a set board 170 electrically connected to the control printed circuit board CPCB. In this case, the set board 170 can also be referred to as a power board. A main power management circuit 160 for managing the overall power of the display device 100 can be present on the set board 170. The main power management circuit 160 can interwork with the display power management circuit 180.

In the so-configured display device 100, the driving voltage is generated in the set board 170 and transferred to the display power management circuit 180 in the control printed circuit board CPCB. The display power management circuit 180 transfers a driving voltage necessary for display driving or characteristic value sensing to the source printed circuit board SPCB through the flexible printed circuit FPC or flexible flat cable FFC. The driving voltage transferred to the source printed circuit board SPCB is supplied to emit light or sense a specific subpixel SP in the display panel 110 through the source driving integrated circuit SDIC.

Each of the subpixels SP arranged in the display panel 110 in the display device 100 can include a light emitting element and a circuit element, e.g., a driving transistor, for allowing the light emitting element to emit light.

The type and number of circuit elements constituting each subpixel SP can be varied depending on functions to be provided and design schemes.

Further, the display device 100 according to aspects of the disclosure can include a memory 150 for storing image data transferred from the host controller 200 or storing data computed by the timing controller 140.

The memory 150 can include a nonvolatile memory such as a flash memory, a resistive random access memory (RRAM), or the like.

When the memory 150 includes a non-volatile memory such as a flash memory, a basic unit capable of accessing data stored in the memory 150 can be defined as a sector, which can be determined according to a configuration of the memory 150.

In this case, the sector corresponding to the basic unit of the flash memory can have a size of 1 KB, 2 KB, or 4 KB, and two or more consecutive sectors can be configured as one block.

Figure 4:
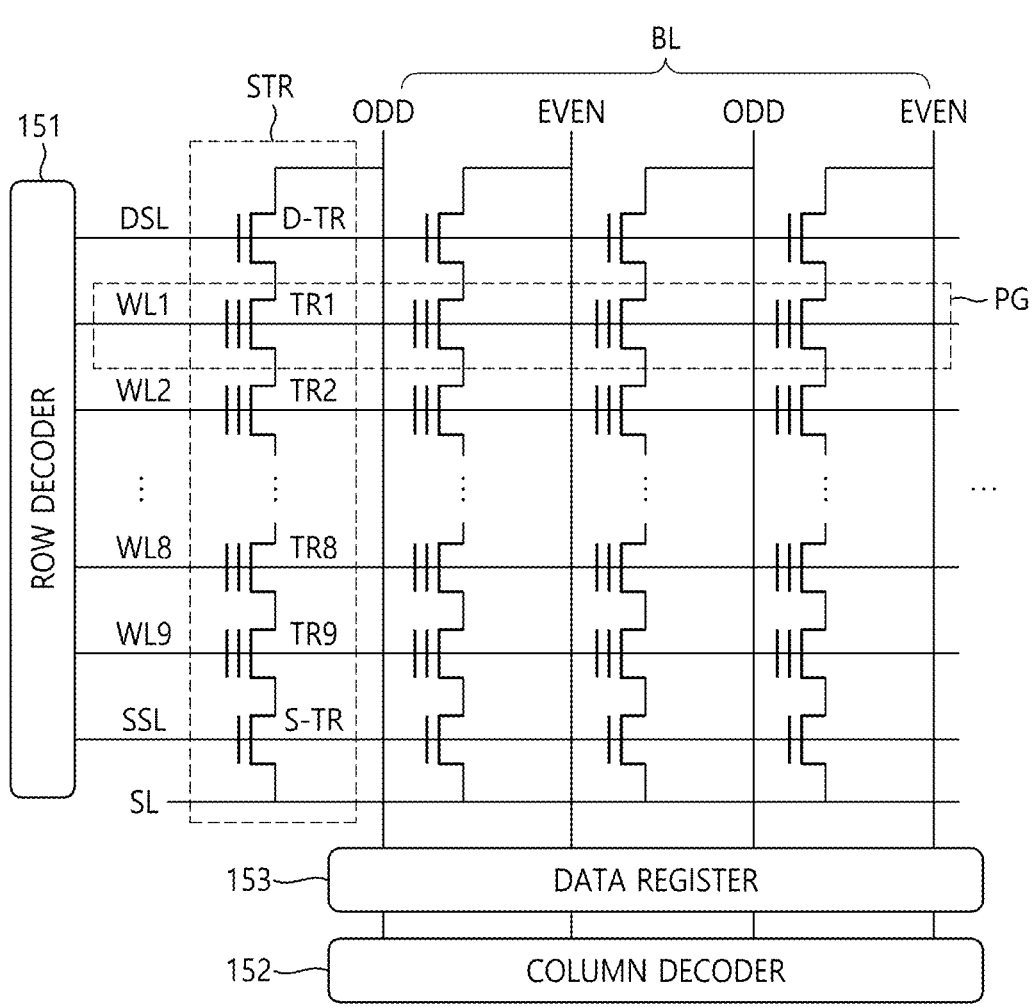
FIG. 4 is a view illustrating an example of a structure of a memory in a display device according to embodiments of the disclosure.

FIG. 4 is a view illustrating an example of a structure of a memory in a display device according to embodiments of the disclosure.

Referring to FIG. 4, in the memory 150 of the display device 100 according to embodiments of the disclosure, there is a core area in which memory cells are gathered and an auxiliary area corresponding to the remaining area of the memory 150 except for the core area and supporting the operation of the memory cells arranged in an array.

The core area can include pages PG and strings STR. In the core area, a plurality of word lines WL1 to WL9 and a plurality of bit lines BL are disposed to cross each other.

The plurality of word lines WL1 to WL9 can be connected to the row decoder 151, and the plurality of bit lines BL can be connected to the column decoder 152. A data register 153 corresponding to a read/write circuit can be present between the plurality of bit lines BL and the column decoder 152.

The plurality of word lines WL1 to WL9 correspond to a plurality of pages PG. For example, each of the plurality of word lines WL1 to WL9 can correspond to one page PG. Alternatively, when each of the plurality of word lines WL1 to WL9 has a large size, each of the plurality of word lines WL1 to WL9 can correspond to two or more (e.g., two or four) pages PG. The page PG can be a minimum unit for performing a write operation and a read operation, and during the write operation and the read operation, all memory cells in the same page PG can simultaneously perform operations.

The plurality of bit lines BL can be connected to the column decoder 152 while being divided into odd-numbered bit lines ODD and even-numbered bit lines EVEN.

In order to access the memory cell, the address can enter the core area through the row decoder 151 and the column decoder 152 to designate the target memory cell. The designating of the target memory cell means accessing to record data, or read data recorded, in memory cells positioned at the intersections of the word lines WL1 to WL9 connected to the row decoder 151 and the bit lines BL connected to the column decoder 152.

Since data processing of the memory 150 is recorded and read via the data register 153, the data register 153 plays a pivotal role. If the data processing of the data register 153 is delayed, all other areas must wait for the data register 153 to complete the data processing. Further, if the performance of the data register 153 is degraded, the overall performance of the memory 150 can be degraded.

A plurality of transistors TR1 to TR9 connected to a plurality of word lines WL1 to WL9 can be present in one string STR. Areas in which a plurality of transistors TR1 to TR9 are present correspond to memory cells.

The plurality of word lines WL1 to WL9 include two outermost word lines WL1 and WL9. A first selection line DSL can be further disposed outside a first outermost word line WL1 more adjacent to the data register 153 in terms of signal path, of the two outermost word lines WL1 and WL9, and a second selection line SSL can be further disposed outside the other second outermost word line WL9.

A first selection transistor D-TR, which is controlled to be turned on and off by the first selection line DSL, is a transistor having only a gate electrode connected to the first selection line DSL but not including a floating gate. A second selection transistor S-TR, which is controlled to be turned on and off by the second selection line SSL, is a transistor having only a gate electrode connected to the second selection line SSL but not including a floating gate.

The first selection transistor D-TR serves as a switch for turning on or off the connection between the corresponding string STR and the data register 153. The second selection transistor S-TR serves as a switch for turning on or off the connection between the corresponding string STR and the source line SL. In other words, the first selection transistor D-TR and the second selection transistor S-TR are positioned at two opposite ends of the corresponding string STR and serve as gatekeepers for connecting and disconnecting signals.

Since the memory 150 needs to fill the target memory cell of the bit line BL to be recorded with electrons during the data recording operation, the first selection transistor D-TR is turned on by applying a predetermined turn-on voltage to the gate electrode of the first selection transistor D-TR, and the second selection transistor S-TR is turned off by applying a predetermined turn-off voltage (e.g., 0V) to the gate electrode of the second selection transistor S-TR.

The memory 150 turns on both the first selection transistor D-TR and the second selection transistor S-TR during a read operation or a verification operation. Accordingly, the current can pass through the corresponding string STR and fall into the source line SL corresponding to the ground, so that the voltage level of the bit line BL can be measured. However, during the read operation, there can be a time difference between on-off timings of the first selection transistor D-TR and the second selection transistor S-TR.

In the erasure operation, the memory 150 can supply a predetermined voltage (e.g., +20V) to the substrate through the source line SL. During the erasure operation, the memory 150 floats both the first selection transistor D-TR and the second selection transistor S-TR to create an infinite resistance. Accordingly, it is structured so that the first selection transistor D-TR and the second selection transistor S-TR are rendered to have no role, and electrons can be operated due to the potential difference only between floating gate and the substrate.

Meanwhile, electrically erasable PROM (EEPROM) has an advantage of being able to read or record data in bytes while being mounted on a printed circuit board. However, when data is recorded in EEPROM, a time delay of several ms or more is required for each byte, so it is not suitable for storing large amounts of data at high speed.

In particular, as the resolution of the display device 100 increases, the need for flash memory increases when a large amount of data needs to be processed at high speed.

Meanwhile, in the case of the vehicle system 1000, the host controller 200 provided in the vehicle system and the timing controller 140 provided in the display device 100 can share one memory 150.

As described above, when the plurality of controllers 200 and 140 share one memory 150, if the mode switching using the memory 150 is not smoothly performed between the plurality of controllers 200 and 140, the display screen is temporarily blocked or the display power needs to be reset.

The display device 100 according to aspects of the disclosure allows mode switching using the memory 150 between the plurality of controllers 200 and 140 to be smoothly performed when the plurality of controllers 200 and 140 share one memory 150, so that a stable display operation can be performed even when the mode switching is performed without blocking the display screen or resetting the display power.

Figure 5:
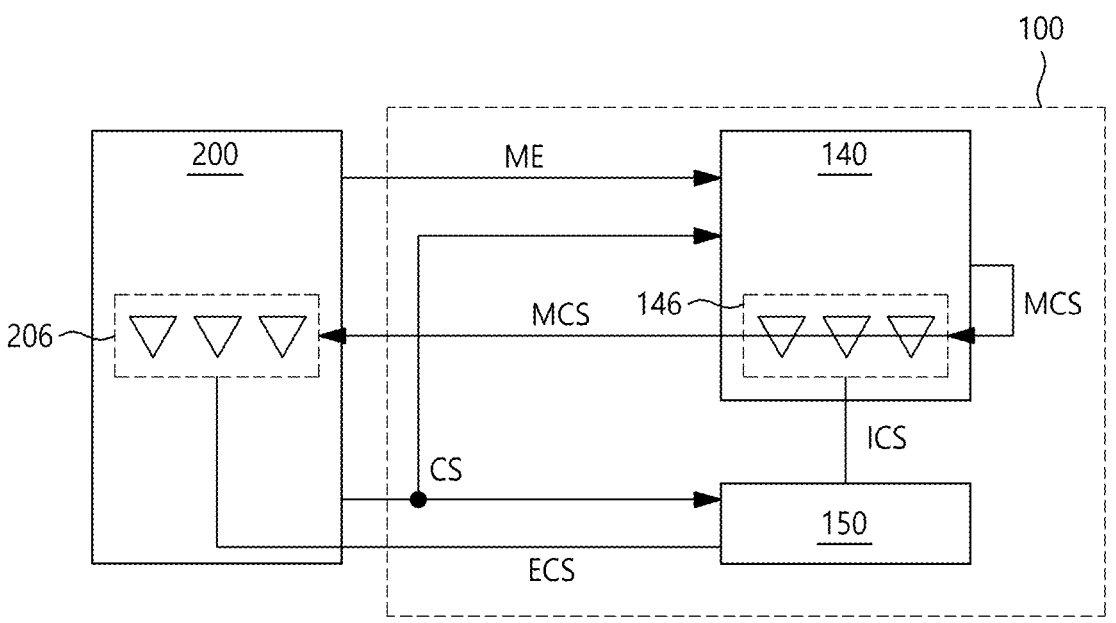
FIG. 5 is a block diagram illustrating a display system according to embodiments of the disclosure.

FIG. 5 is a block diagram illustrating a display system according to embodiments of the disclosure.

Referring 5 system according to embodiments of the disclosure can include a display device 100 connected to a host controller 200.

The display device 100 can include a timing controller 140 including a slave buffer 146, a memory 150, a display panel 110, and the like.

The host controller 200 can include a master buffer 206. The host controller 200 can control the memory 150 of the display device 100 using an external control signal ECS transferred through the master buffer 206.

The timing controller 140 can access the memory 150 using an internal control signal ICS transferred through the slave buffer 146.

The memory 150 can store image control data such as gamma data for controlling luminance of the image displayed on the display panel 110 in the form of a lookup table.

The display device 100 can operate in a first mode for displaying an image under the control of the host controller 200 and a second mode for displaying an image under the control of the timing controller 140.

When the display device 100 operates in the first mode, the memory 150 can be controlled by the external control signal ECS supplied from the master buffer 206 under the control of the host controller 200. When the display device 100 operates in the second mode, the memory 150 can be controlled by the internal control signal ICS supplied from the slave buffer 146 under the control of the timing controller 140.

The master buffer 206 and the slave buffer 146 can be switched to a turn-on state or a high impedance state according to a mode control signal MCS generated in the display device 100, e.g., in the timing controller 140.

The master buffer 206 and the slave buffer 146 can be tri-state buffers that transfer or block the external control signal ECS or the internal control signal ICS by the mode control signal MCS.

The master buffer 206 can be positioned inside the host controller 200, and the slave buffer 146 can be positioned inside the timing controller 140. Alternatively, the slave buffer 146 can be a separate component and positioned on the control printed circuit board (CPCB) outside the timing controller 140.

The host controller 200 can transfer whether the first mode operates to the timing controller 140 using the mode enable signal ME and the chip selection signal CS. The mode enable signal ME and the chip selection signal CS can be referred to as first mode signals. The mode enable signal ME is a first mode entry signal for the host controller 200 to control the memory 150, and the chip selection signal CS corresponds to a selection signal for the host controller 200 to select a chip in the memory 150 in the first mode so as to access specific data stored in the chip.

When the host controller 200 enters the first mode for controlling the display operation, the host controller 200 can transfer the operation of entering the first mode by applying the mode enable signal ME at the turn-on level, and select a chip inside the memory 150 to be controlled using the chip selection signal CS.

When entering the first mode, the mode enable signal ME can be first changed to the turn-on level, and then the chip selection signal CS can be changed to the turn-on level. On the other hand, when entering the second mode, the chip selection signal CS can be first changed to the turn-off level, and then the mode enable signal ME can be changed to the turn-off level.

When both the mode enable signal ME and the chip selection signal CS are at the turn-on level, the timing controller 140 determines that the first mode is entered, and maintains the slave buffer 146 in the high impedance state and the master buffer 206 in the turn-on state through the mode control signal MCS.

Accordingly, when the timing controller 140 switches from the second mode in which the image is displayed to the first mode in which the host controller 200 controls the display operation, the display device 100 according to aspects of the disclosure can allow the control authority of the memory 150 to be smoothly changed. As a result, power consumption can be reduced by reducing unnecessary driving loss for mode switching, and continuous display operations can be performed without blocking the display screen or resetting the display power during the mode switching process.

Figure 6:
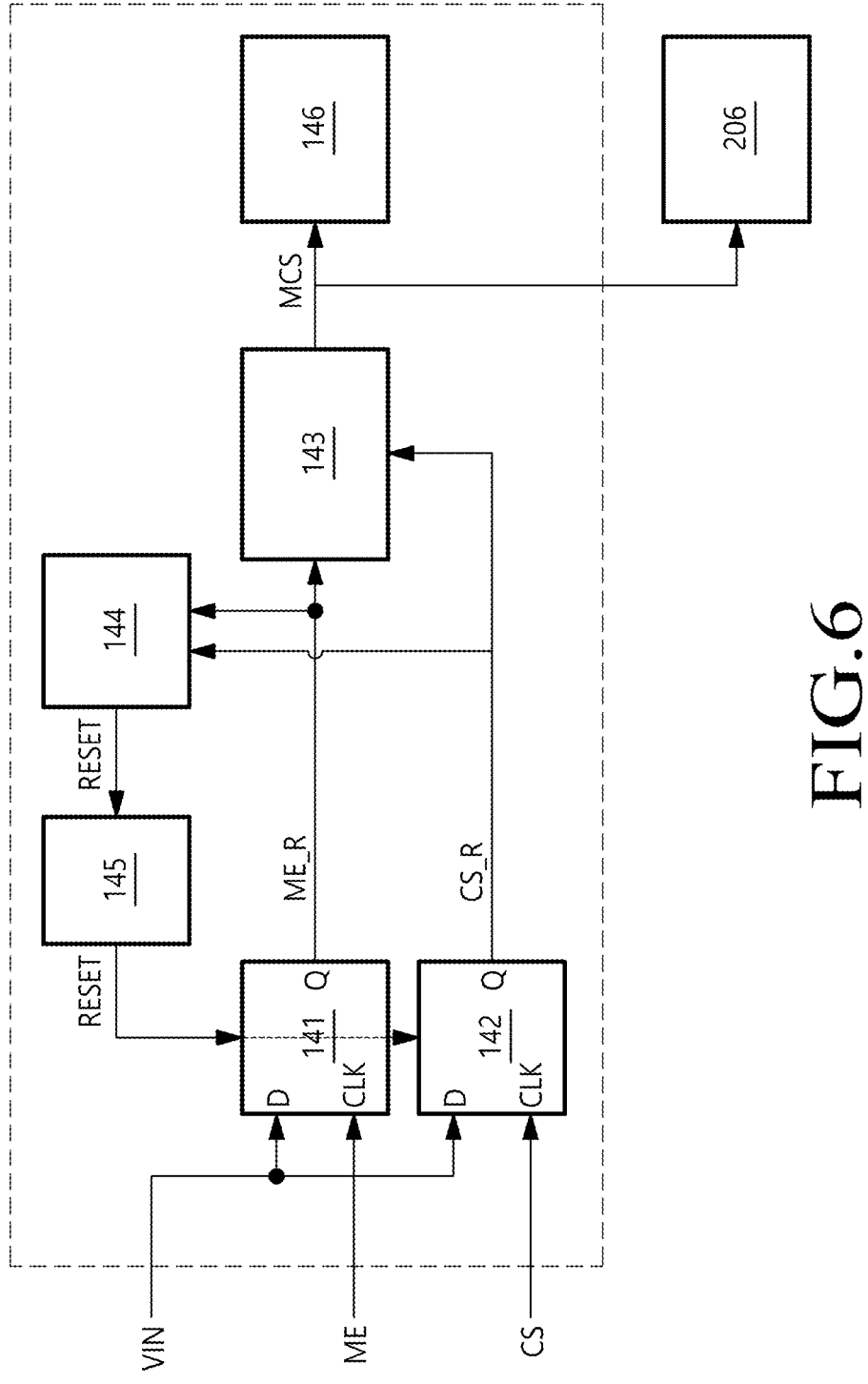
FIG. 6 is a block diagram illustrating a mode control signal generation circuit in a display device according to embodiments of the disclosure.
Figure 7:
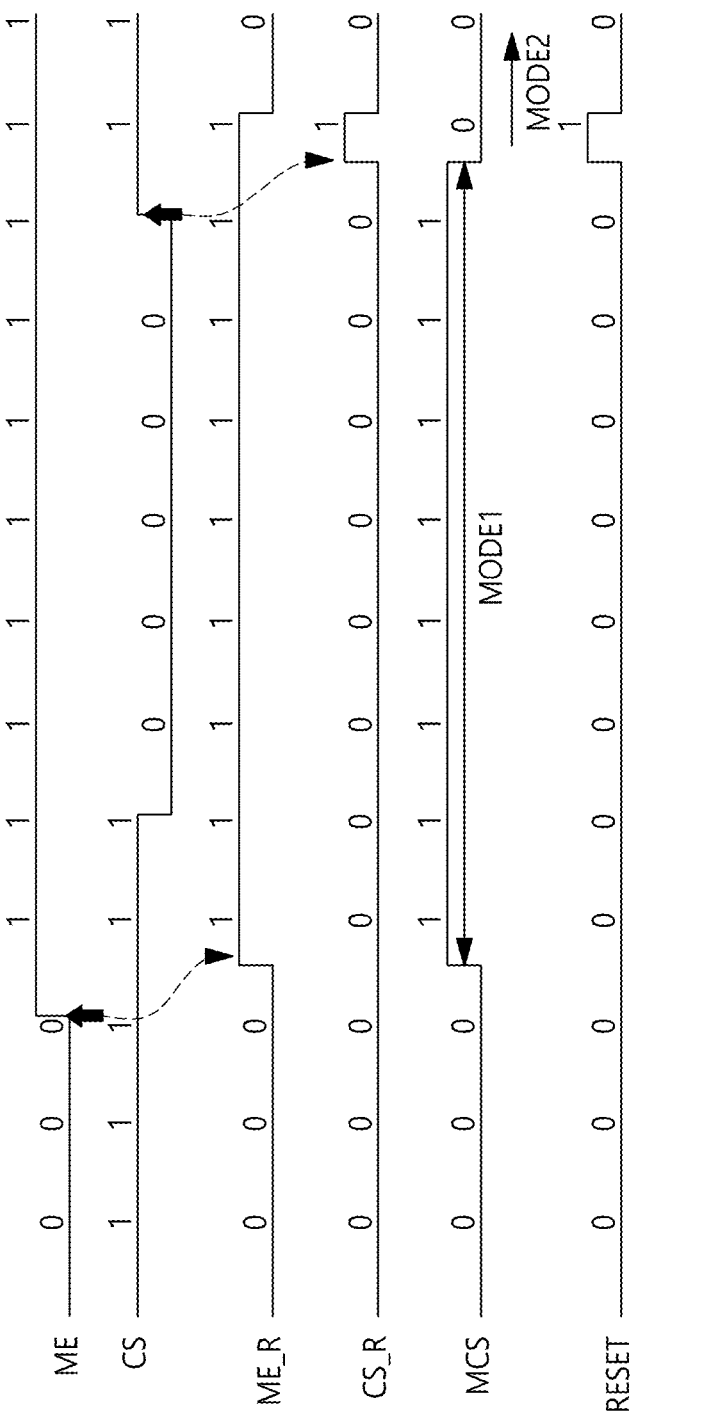
FIG. 7 is a view illustrating each node signal waveform of a mode control signal generation circuit in a display device according to embodiments of the disclosure.

FIG. 6 is a block diagram illustrating a mode control signal generation circuit in a display device according to embodiments of the disclosure. FIG. 7 is a view illustrating each node signal waveform of a mode control signal generation circuit in a display device according to embodiments of the disclosure.

Referring to FIGS. 6 and 7, in the display device 100 according to embodiments of the disclosure, the mode control signal generation circuit can be positioned inside the timing controller 140 or can be disposed on a control printed circuit board CPCB. Here, an example in which the mode control signal generation circuit is positioned inside the timing controller 140 is illustrated.

The timing controller 140 can include a first edge detection circuit 141, a second edge detection circuit 142, a first logic gate 143, a second logic gate 144, a reset buffer 145, and a slave buffer 146, as shown in FIG. 6. The first edge detection circuit 141, the second edge detection circuit 142, the first logic gate 143, and the second logic gate 144 (optionally the reset buffer 145) constitute the mode control signal generation circuit.

The first edge detection circuit 141 can detect an edge where the mode enable signal ME transferred from the host controller 200 is turned on. The first edge detection circuit 141 can be a flip-flop (flip-flop circuit) that operates according to the input signal VIN and receives the mode enable signal ME through a clock terminal.

When the turn-on level of the mode enable signal ME is the high level, the first edge detection circuit 141 can detect an edge where the mode enable signal ME is switched from the low level to the high level to generate the mode enable edge signal ME_R of the high level. In other words, the high-level mode enable edge signal ME_R can indicate that the mode enable signal ME is at the turn-on level.

In this case, due to the clock timing of the first edge detection circuit 141, a time delay can occur between the mode enable signal ME and the mode enable edge signal ME_R.

The second edge detection circuit 142 can detect an edge where the chip selection signal CS transferred from the host controller 200 is turned off. The second edge detection circuit 142 can be a flip-flop (flip-flop circuit) that operates according to the input signal VIN and receives the chip selection signal CS through a clock terminal.

When the turn-on level of the chip selection signal CS is the low level, the second edge detection circuit 142 can generate the chip selection edge signal CS_R by detecting an edge where the chip selection signal CS is switched from the low level to the high level. In other words, the high-level chip selection edge signal CS_R can indicate that the chip selection signal CS is at the turn-off level.

In this case, a time delay can occur between the chip selection signal CS and the chip selection edge signal CS_R due to the clock timing of the second edge detection circuit 142.

The first logic gate 143 generates the mode control signal MCS using the mode enable edge signal ME_R and the chip selection edge signal CS_R.

For example, the mode control signal MCS can be output at the high level during a first mode period MODE1 controlled by the host controller 200, and can be output at the low level in a second mode period MODE2 controlled by the timing controller 140. In other words, the mode control signal MCS can represent the first mode period MODE1 from the time point where the mode enable signal ME is turned on to the time point where the chip selection signal CS is turned off as a high level.

To that end, the first logic gate 143 can include an XOR gate capable of detecting a case in which the mode enable edge signal ME_R is at a high level and the chip selection edge signal CS_R is at a low level. When the chip selection edge signal CS_R is at a high level (the chip selection signal CS is at a turn-off level), the first edge detection circuit 141 and the second edge detection circuit 142 are reset by the reset signal RESET generated by the second logic gate 144, and thus, a case where the mode enable edge signal ME_R is at a low level and the chip selection edge signal CS_R is at a high level does not occur.

The first mode period MODEL can be terminated at a time when the chip selection signal CS is switched from the turn-on level (low level) to the turn-off level (high level).

To that end, the second logic gate 144 can generate a reset signal RESET capable of resetting the first edge detection circuit 141 and the second edge detection circuit 142 by detecting a time where the chip selection signal CS is changed to the turn-off level (high level) while the mode enable signal ME is at the turn-on level (high level).

In other words, the second logic gate 144 outputs the reset signal RESET at a time when the chip selection edge signal CS_R is changed to the high level while the mode enable edge signal ME_R is at the high level. The reset signal RESET can be applied to the reset terminals of the first edge detection circuit 141 and the second edge detection circuit 142 through the reset buffer 145. The reset buffer 145 delays the reset signal for a predetermined time.

To that end, the second logic gate 144 can include an AND gate that detects a case in which the mode enable edge signal ME_R is at a high level and the chip selection edge signal CS_R is at a high level.

In this case, the reset buffer 145 can be omitted.

The period in which the mode control signal MCS is output at the low level can correspond to the second mode period MODE2 in which the display operation is controlled by the timing control 140.

Accordingly, the slave buffer 146 provided in the timing controller 140 can be turned on by the low-level mode control signal MCS to transfer the internal control signal ICS, and can become a high-impedance state by the high-level mode control signal MCS to block the internal control signal ICS.

On the other hand, the master buffer 206 provided in the host controller 200 can be turned on by the high-level mode control signal MCS to transfer the external control signal ECS, and can become a high-impedance state by the low-level mode control signal MCS to block the external control signal ECS.

Figure 8:
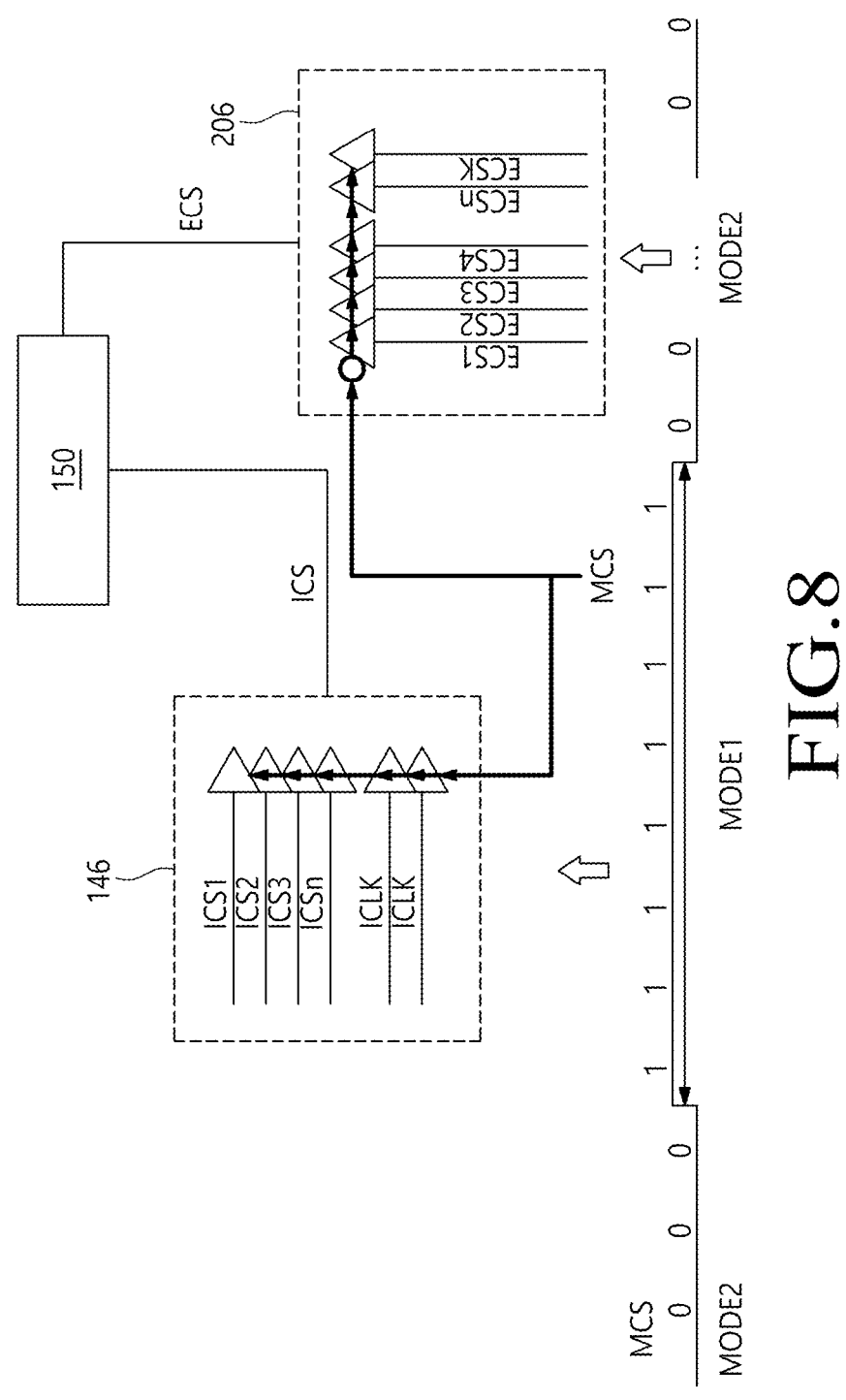
FIG. 8 is a view illustrating a structure in which a master buffer and a slave buffer are controlled according to a mode control signal in a display device according to embodiments of the disclosure.

FIG. 8 is a view illustrating a structure in which a master buffer and a slave buffer are controlled according to a mode control signal in a display device according to embodiments of the disclosure.

Referring to FIG. 8, in the display device 100 according to embodiments of the disclosure, the host controller 200 and the timing controller 140 can share one memory 150.

The host controller 200 can access the memory 150 by transferring the external control signal ECS through the master buffer 206. The external control signal ECS can include an external clock signal ECLK and n external control signals ECS1 to ECSn.

The timing controller 140 can access the memory 150 by transferring the internal control signal ICS through the slave buffer 146. The internal control signal ICS can include an internal clock signal ICLK and n internal control signals ICS1 to ICSn.

In this case, the host controller 200 can transfer whether to enter the first mode to the timing controller 140 using the mode enable signal ME and the chip selection signal CS.

The timing controller 140 maintains the slave buffer 146 in the high-impedance state and the master buffer 206 in the turn-on state through the mode control signal MCS during the first mode period MODE1 in which both the mode enable signal ME and the chip selection signal CS are at turned-on levels, thereby allowing the host controller 200 to control the memory 150.

On the other hand, the timing controller 140 can control the memory 150 by maintaining the slave buffer 146 in the turn-on state and the master buffer 206 in the high-impedance state through the mode control signal MCS during the second mode period MODE2 in which the mode enable signal ME and the chip selection signal CS are at turned-off levels.

As such, the display device 100 according to aspects of the disclosure can smoothly change control authority on the memory 150 when switching from the second mode in which the display operation is controlled by the timing controller 140 to the first mode in which the display operation is controlled by the host controller 200, thereby preventing defects in the display screen and enabling stable display operation.

Embodiments of the disclosure described above can be briefly described below.

A display device according to aspects of the disclosure can comprise a display panel including a plurality of sub-pixels, a memory storing image control data for controlling an image displayed on the display panel, a mode control signal generation circuit generating a mode control signal based on a first mode signal supplied from a first controller, and a second controller configured to share the memory with the first controller and determine a control authority of the first controller for the memory through the mode control signal.

The image control data can be gamma data for controlling a luminance of the image displayed on the display panel.

The first controller can be a host controller, and the second controller can be a timing controller.

The first controller can include a master buffer transferring an external control signal to the memory, and the display device can further include a slave buffer transferring an internal control signal to the memory and positioned inside the second controller or on a control printed circuit board outside the second controller. The master buffer and the slave buffer can be controlled by the mode control signal.

The mode control signal can maintain the master buffer in a turn-on state and the slave buffer in a high-impedance state in a first mode period in which the first controller controls the memory.

The mode control signal can maintain the master buffer in a high-impedance state and the slave buffer in a turn-on state in a second mode period in which the second controller controls the memory.

The first mode signal can include a mode enable signal indicating entry into a first mode in which the first controller controls the memory, and a chip selection signal selecting, for the first controller, a chip in the memory in the first mode.

The mode control signal generation circuit can include a first edge detection circuit generating a mode enable edge signal by detecting an edge where the mode enable signal is turned on, a second edge detection circuit generating a chip selection edge signal by detecting an edge where the chip selection signal is turned off, a first logic gate generating the mode control signal using the mode enable edge signal and the chip selection edge signal, and a second logic gate generating a reset signal for a reset operation of the first edge detection circuit and the second edge detection circuit using the mode enable edge signal and the chip selection edge signal.

The first edge detection circuit can be a flip-flop circuit for receiving the mode enable signal through a clock terminal.

The second edge detection circuit can be a flip-flop circuit for receiving the chip selection signal through a clock terminal.

The first logic gate can be an XOR gate. The second logic gate can be an AND gate.

The mode control signal generation circuit can further include a reset buffer delaying the reset signal for a predetermined time.

The mode control signal generation circuit can be positioned in the second controller.

The mode control signal generation circuit can be positioned on a control printed circuit board.

When entering the first mode, the mode enable signal can be first changed to the turn-on level, and then the chip selection signal can be changed to the turn-on level.

When entering a second mode in which the second controller controls the memory, the chip selection signal can be first changed to the turn-off level, and then the mode enable signal can be changed to the turn-off level.

A timing controller according to aspects of the disclosure can comprise a first edge detection circuit generating a mode enable edge signal by detecting an edge where a mode enable signal supplied from a host controller is turned on, a second edge detection circuit generating a chip selection edge signal by detecting an edge where a chip selection signal supplied from the host controller is turned off, a first logic gate generating a mode control signal for determining a control authority of the host controller for a memory using the mode enable edge signal and the chip selection edge signal, and a second logic gate generating a reset signal for a reset operation of the first edge detection circuit and the second edge detection circuit using the mode enable edge signal and the chip selection edge signal, wherein the timing controller shares the memory with the host controller.

The timing controller can further comprise a slave buffer transferring an internal control signal to the memory. The host controller can comprise a master buffer transferring an external control signal to the memory, and the master buffer and the slave buffer can be controlled by the mode control signal.

The mode control signal can maintain the master buffer in a turn-on state and the slave buffer in a high-impedance state in a first mode period in which the host controller controls the memory.

The mode control signal can maintain the master buffer in a high-impedance state and the slave buffer in a turn-on state in a second mode period in which the timing controller controls the memory.

A display system according to aspects of the disclosure can comprise the display device as described above and a first controller connected to the display device.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The above description and the accompanying drawings provide an example of the technical idea of the disclosure for illustrative purposes only. For example, the disclosed embodiments are intended to illustrate the scope of the technical idea of the disclosure.

What is claimed:

1. A display device, comprising:
a display panel configured to display an image;
a memory configured to store image control data for controlling the image displayed on the display panel, the memory including a plurality of chips;
a mode control signal generation circuit configured to generate a mode control signal based on a first mode signal supplied from a first controller; and
a second controller configured to share the memory with the first controller and determine a control authority of the first controller for the memory through the mode control signal,
wherein the first controller includes a master buffer configured to transfer an external control signal to the memory,
wherein the display device further comprises a slave buffer configured to transfer an internal control signal to the memory, the slave buffer being positioned inside the second controller or on a control printed circuit board outside the second controller, and
wherein the master buffer and the slave buffer are controlled by the mode control signal.

2. The display device of claim 1, wherein the image control data includes gamma data for controlling a luminance of the image displayed on the display panel.

3. The display device of claim 1, wherein the first controller is a host controller, and the second controller is a timing controller.

4. The display device of claim 1, wherein the mode control signal maintains the master buffer in a turn-on state and the slave buffer in a high-impedance state in a first mode period in which the first controller controls the memory.

5. The display device of claim 1, wherein the mode control signal maintains the master buffer in a high-impedance state and the slave buffer in a turn-on state in a second mode period in which the second controller controls the memory.

6. The display device of claim 1, wherein the first mode signal includes:
a mode enable signal configured to indicate entry into a first mode in which the first controller controls the memory; and
a chip selection signal configured to select, for the first controller, a chip of the plurality of chips of the memory in the first mode.

7. The display device of claim 6, wherein the mode control signal generation circuit includes:
a first edge detection circuit configured to generate a mode enable edge signal by detecting an edge where the mode enable signal is turned on;
a second edge detection circuit configured to generate a chip selection edge signal by detecting an edge where the chip selection signal is turned off;
a first logic gate configured to generate the mode control signal using the mode enable edge signal and the chip selection edge signal; and a second logic gate configured to generate a reset signal for a reset operation of the first edge detection circuit and the second edge detection circuit using the mode enable edge signal and the chip selection edge signal.

8. The display device of claim 7, wherein the first edge detection circuit is a flip-flop circuit for receiving the mode enable signal through a clock terminal.

9. The display device of claim 7, wherein the second edge detection circuit is a flip-flop circuit receiving the chip selection signal through a clock terminal.

10. The display device of claim 7, wherein the first logic gate is an XOR gate.

11. The display device of claim 7, wherein the second logic gate is an AND gate.

12. The display device of claim 7, wherein the mode control signal generation circuit further includes a reset buffer configured to delay the reset signal for a predetermined time.

13. The display device of claim 7, wherein when entering the first mode, the mode enable signal is first changed to a turn-on level, and then the chip selection signal is changed to a turn-on level.

14. The display device of claim 7, wherein when entering a second mode in which the second controller controls the memory, the chip selection signal is first changed to a turn-off level, and then the mode enable signal is changed to a turn-off level.

15. The display device of claim 1, wherein the mode control signal generation circuit is positioned in the second controller.

16. The display device of claim 1, wherein the mode control signal generation circuit is positioned on a control printed circuit board.

17. A display system comprising:
the display device of claim 1, wherein the display panel includes a plurality of subpixels configured to display the image; and
the first controller connected to the display device.

18. A timing controller, comprising:
a first edge detection circuit configured to generate a mode enable edge signal by detecting an edge where a mode enable signal supplied from a host controller is turned on;
a second edge detection circuit configured to generate a chip selection edge signal by detecting an edge where a chip selection signal supplied from the host controller is turned off;
a first logic gate configured to generate a mode control signal for determining a control authority of the host controller for a memory using the mode enable edge signal and the chip selection edge signal; and
a second logic gate configured to generate a reset signal for a reset operation of the first edge detection circuit and the second edge detection circuit using the mode enable edge signal and the chip selection edge signal,
wherein the timing controller shares the memory with the host controller.

19. The timing controller of claim 18, further comprising a slave buffer configured to transfer an internal control signal to the memory,
wherein the host controller comprises a master buffer configured to transfer an external control signal to the memory, and the master buffer and the slave buffer are controlled by the mode control signal.

20. The timing controller of claim 19, wherein the mode control signal maintains the master buffer in a turn-on state and the slave buffer in a high-impedance state in a first mode period in which the host controller controls the memory.

21. The timing controller of claim 19, wherein the mode control signal maintains the master buffer in a high-impedance state and the slave buffer in a turn-on state in a second mode period in which the timing controller controls the memory.

\* \* \* \* \*